(12) United States Patent
James et al.

(10) Patent No.: US 6,473,311 B1
(45) Date of Patent: Oct. 29, 2002

(54) GATE AREA RELIEF STRIP FOR A MOLDED I/C PACKAGE

(75) Inventors: Stephen L. James, Boise, ID (US); Richard W. Wensel, Boise, ID (US); Brad D. Rumsey, Meridian, ID (US)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 09/586,048

(22) Filed: Jun. 2, 2000

(51) Int. Cl.[7] .............................. H05K 7/02; H05K 7/06; H05K 7/08; H05K 7/10
(52) U.S. Cl. ...................... 361/777; 174/52.2; 174/260; 361/783
(58) Field of Search ................................. 361/760–783; 174/260, 52.2; 257/787–796; 29/841

(56) References Cited

U.S. PATENT DOCUMENTS 5,818,698 A * 10/1998 Corisis ........................ 361/760
6,208,525 B1 * 3/2001 Imasu et al. ................. 361/783

* cited by examiner

Primary Examiner—David L. Talbott
Assistant Examiner—Jeremy Norris
(74) Attorney, Agent, or Firm—Fletcher, Yoder & Van Someren

(57) ABSTRACT

A method and device for providing a relief area on the surface of a molded I/C package. Specifically, a method of reducing delamination at the gate area of a molded I/C package by disposing an area of patterned metal traces on the substrate surface to form a relief area. The relief area will permit the I/C package to be broken away form the molding apparatus while reducing the possibility of delamination or Au/Cu burs at the gate area.

39 Claims, 9 Drawing Sheets

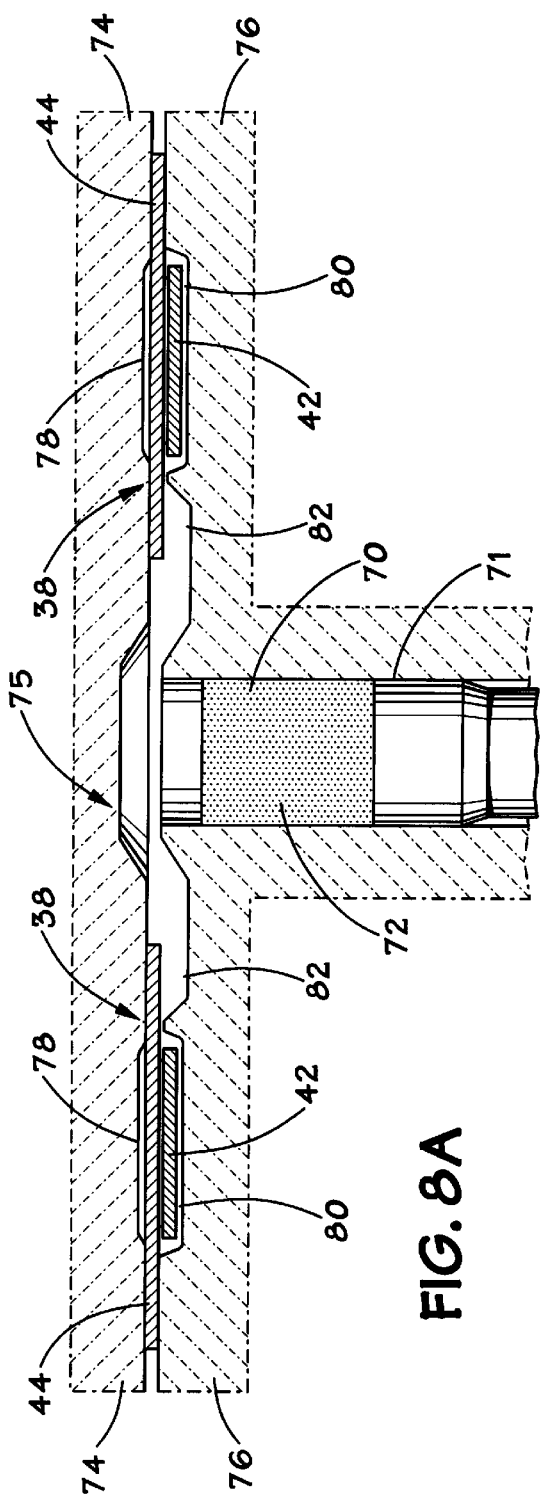
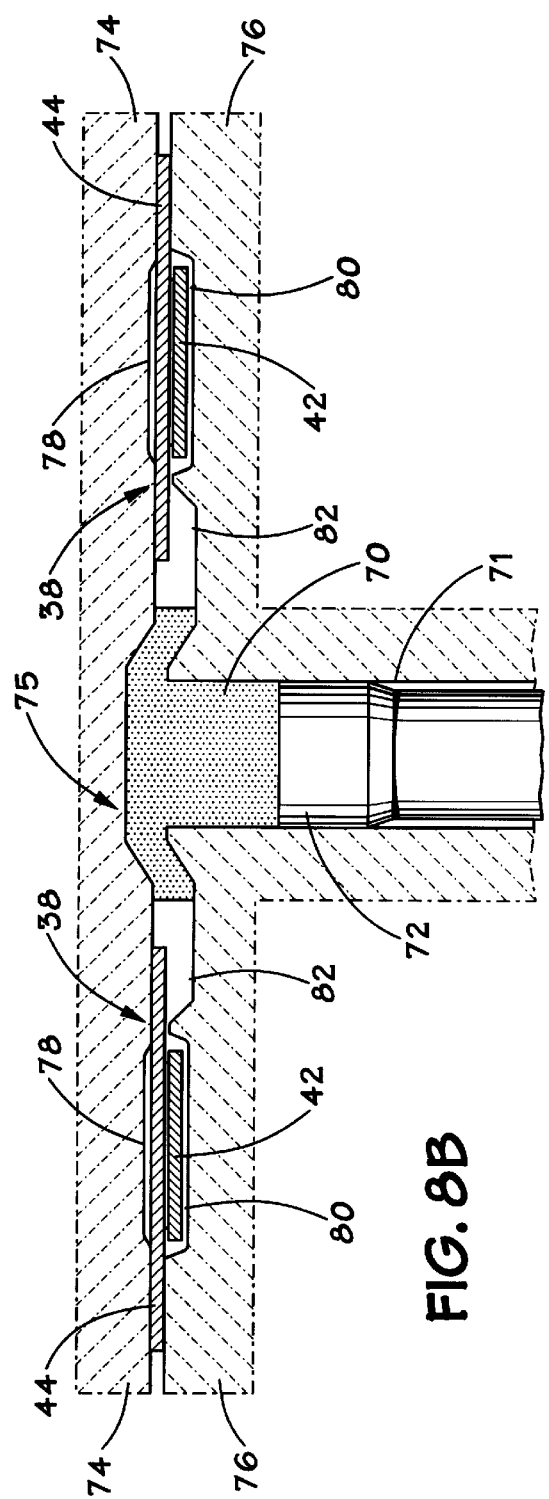

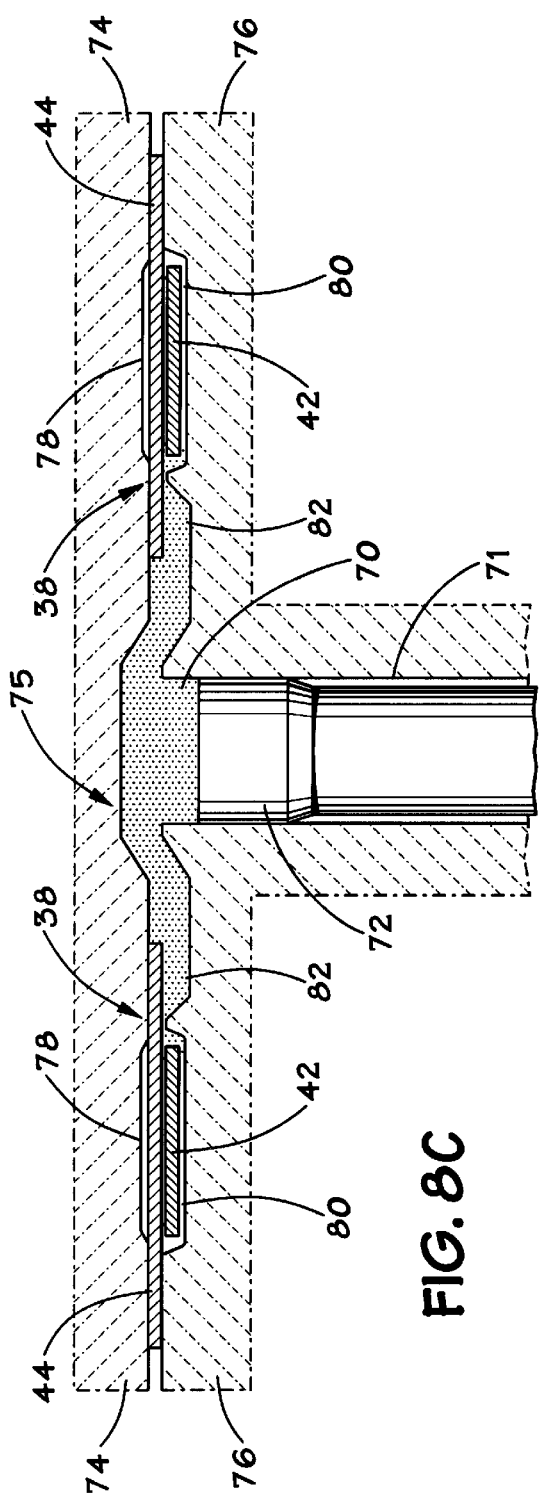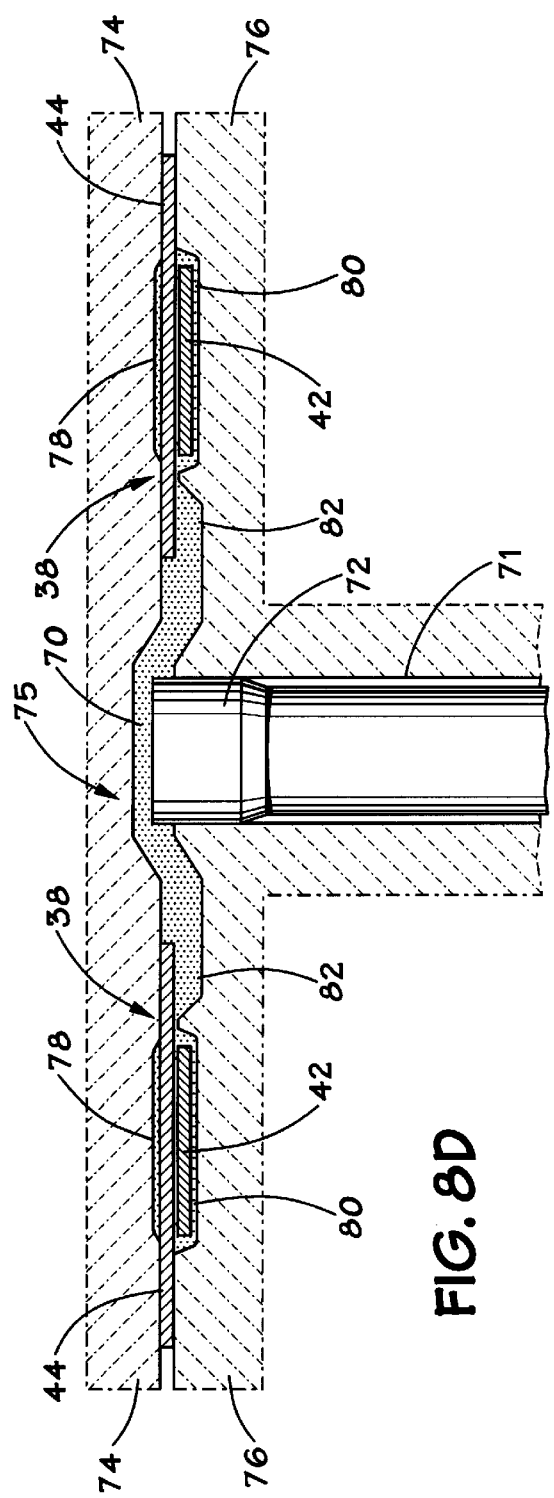

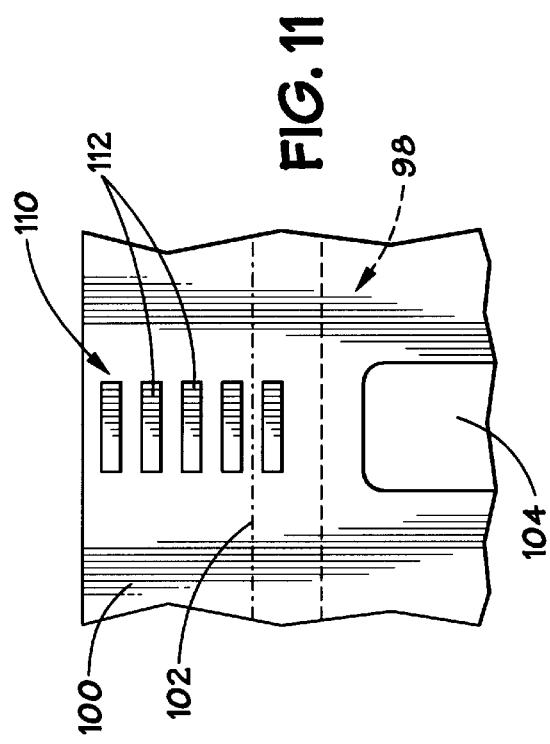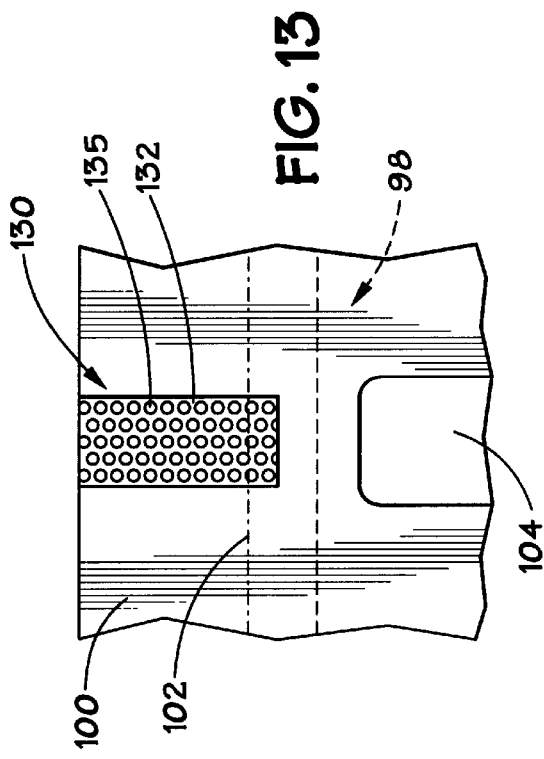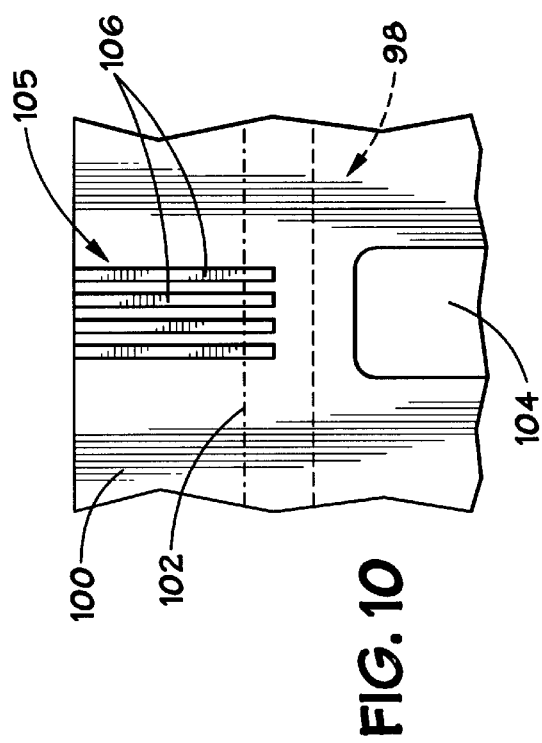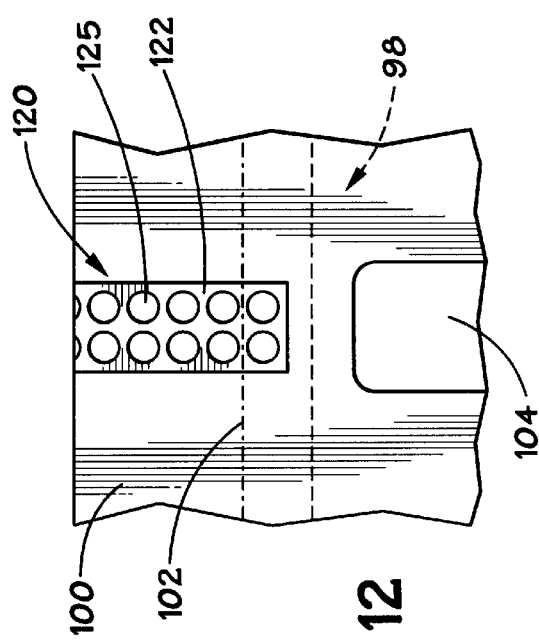

GATE AREA RELIEF STRIP FOR A MOLDED I/C PACKAGE

BACKGROUND OF THE INVENTION

1. Field of the Invention

The present invention relates generally to microelectronic packaging and, more particularly, to molding an integrated circuit device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor.

Devices in these types of circuits are typically formed on a semiconductor die and placed in what is known in the art as a package. Many electrical circuits are packaged for surface mounting, and Fine-Pitch Surface Mount Technology (FPT) and Pin Grid Array (PGA) technology are well developed areas of this type packaging technology. In addition, an emerging packaging method has been developed using Ball Grid Array (BGA) technology.

A BGA semiconductor package generally includes a semiconductor chip mounted on the upper surface of a substrate. The semiconductor chip may be electrically coupled to the substrate by bonding wires or conductive paste. The substrate contains conductive routing which allows the signals to pass from the semiconductor chip on the upper surface of the substrate, through the substrate, and to pads on the underside of the substrate. A plurality of solder balls are deposited and electrically coupled to the pads on the underside of the substrate to be used as input/output terminals for electrically connecting the substrate to a printed circuit board (PCB) or other external device.

The packaging of electrical circuits is a key element in the technological development of any device containing electrical components. A single integrated circuit die is typically encapsulated within a sealed package to be mounted on a PCB or another suitable apparatus for incorporation into a system. The integrated circuit die is generally encapsulated within a molding compound to protect the die from external contamination or physical damage. Because the integrated circuit die is generally encapsulated, the encapsulated integrated circuit package also provides a system of interconnects for electrically coupling the integrated circuit die to a PCB or other external device.

Three common techniques for mounting an integrated circuit die on a substrate include Chip-on-Board (COB), Board-on-Chip (BOC), and Flip-Chip (F/C). In a COB package, the integrated circuit die may be attached to the substrate "face-up." That is to say that the side of integrated circuit die containing the bond pads for wire bonding the integrated circuit die to the substrate is left exposed. This side is often referred to as the upper surface of the die. The backside of the integrated circuit die not containing the bond pads is adhered to the substrate. In this type of package, bond wires are attached from the upper surface of the integrated circuit die and to pads on the upper surface of the substrate to electrically couple the integrated circuit die to the substrate. The substrate contains electrical routing which routes the signals from the upper surface of the substrate to the underside of the substrate.

Alternately, the integrated circuit die may be mounted on the substrate "face-down," to create a BOC. In this instance, the substrate typically contains a slot. Since the integrated circuit die is mounted face down, the bond pads on the upper surface of the die are arranged to correlate with the slot opening in the substrate. Bond wires are attached from the bond pads on the die, through the slot in the substrate, and to the underside of the substrate. The substrate contains electrical routing to distribute electrical signals along the backside of the substrate.

For F/C packages, the integrated circuit die is mounted on the substrate face-down as in the BOC package. For a F/C package, bond wires are not used to electrically couple the integrated circuit die to the substrate. Instead, solder bumps located on the face of the integrated circuit die are aligned with conductive pads on the upper surface of the substrate. The solder bumps may be reflowed to electrically couple the integrated circuit die to the substrate. The substrate contains electrical routing to distribute electrical signals from the die along the backside of the substrate.

Regardless of whether COB, BOC or F/C mounting techniques are used, the package is generally encapsulated in a molding compound to protect the integrated circuit device and bond wires from external elements such as moisture, dust, or impact. A transfer molding system or an injection molding system may be used to dispose a molding compound about the package. In an injection molding system, a package is mounted into a system and a molding compound is injected through a runner and onto the package via a gate area. Once the molding process is complete, the package is removed from the system by breaking the molding compound along the runner away from the package at the gate area. However, breaking the compound at the gate area often creates separation problems between the molding compound and the substrate. To mitigate this effect, a release material may be disposed on the surface of the substrate at the gate area. While the release material may facilitate removal of the package from the molding compound, the break area is often left rough as a result of lifting of the release material. This often results in rejection or failure of the package at inspection or test.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system having a processor and a memory package operatively coupled to the processor. The memory package has a memory device attached to a substrate, and a molding compound disposed on the substrate. The substrate also has a relief region.

In another embodiment of the present invention, there is provided an integrated circuit package having an integrated circuit device coupled to a substrate, and a molding compound disposed on the substrate. The substrate also has a relief region.

In still another embodiment of the present invention, there is provided a method of building an integrated circuit package comprising the acts of: providing a substrate; disposing a relief region onto the surface of the substrate; disposing an integrated circuit device onto the substrate; and disposing a molding compound about the integrated circuit device.

In yet another embodiment of the present invention, there is provided a method of building an integrated circuit package comprising the acts of: providing a substrate having a relief area on a surface of the substrate; disposing an integrated circuit device onto the substrate; and disposing a molding compound about the integrated circuit device.

BRIEF DESCRIPTION OF THE DRAWINGS

The foregoing and other advantages and features of the invention will become apparent upon reading the following detailed description and upon reference to the drawings in which:

FIGS. 8A–8E illustrate an injection molding system at various stages during a molding process;

FIG. 10, illustrates a first embodiment of the relief area in accordance with the present invention;

FIG. 11 illustrates a second embodiment of the relief area in accordance with the present invention;

FIG. 12 illustrates a third embodiment of the relief area in accordance with the present invention;

FIG. 13 illustrates a fourth embodiment of the relief area in accordance with the present invention;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
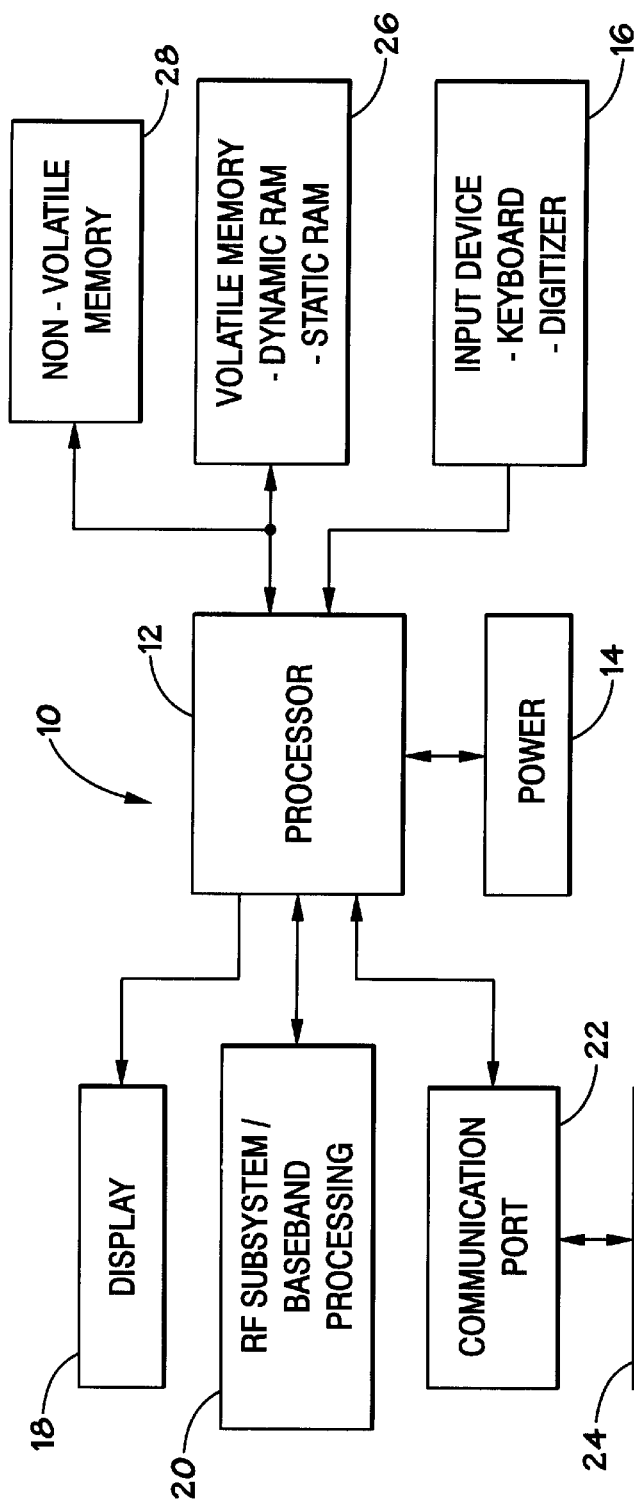
FIG. 1 illustrates a block diagram of an exemplary processor-based device in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include, for example, a flat panel display, an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). One or more communication ports 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
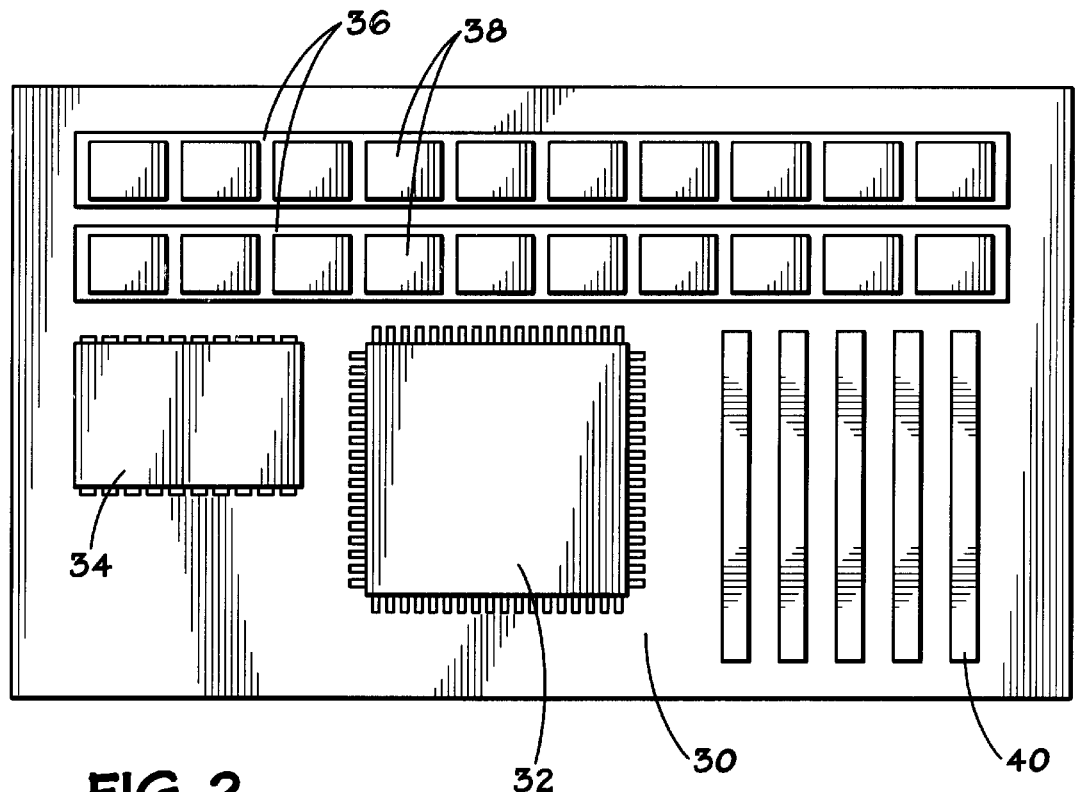
FIG. 2 illustrates a plan view of a circuit board having various devices employed thereon in accordance with the present invention.

Referring to FIG. 2, a circuit board 30 is shown having various devices and connections coupled to its surface. In this example, a microprocessor 32 is shown along with a ROM device 34 and a set of memory modules 36, each containing a plurality of RAM chips 38 mounted on a suitable substrate, such as a PCB. A plurality of connections or ports 40 are also located on the circuit board 30 allowing for connection to various peripheral devices and expansion modules. In a computer application, for example, such devices and expansion modules might include sound cards, video cards, additional memory modules, or connections for input and output peripherals. While the present embodiment has a direct relation to memory chips, such as the ROM device 34 and RAM chip 38, the techniques as described below, may be applied to any device package having similar mounting characteristics including, if desired, the microprocessor 32.

Figure 3:
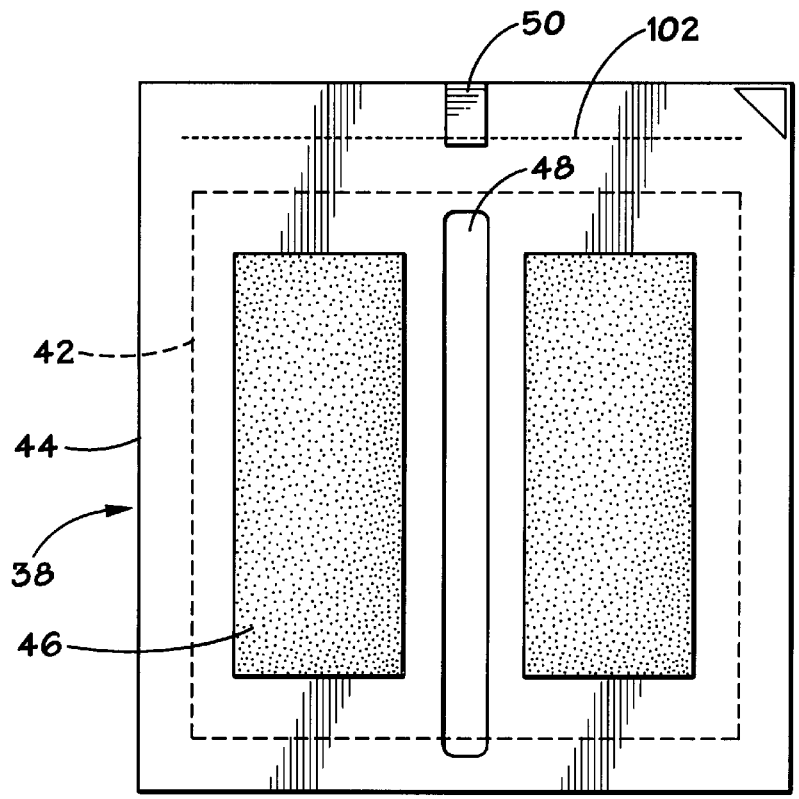
FIG. 3 illustrates a top frontside view of a BOC substrate in accordance with the present invention.

Referring to FIG. 3, RAM device 38 is depicted as a typical BGA device. The BGA device 38 includes an integrated circuit die, here a memory chip 42 (shown by phantom lines) attached to a substrate 44. FIG. 3 illustrates a frontside view of the substrate 44. The memory chip 42 is adhered to the substrate 44 by an adhesive material 46, such as tape or paste. The substrate 44 is depicted as a BOC substrate and therefore has a slot 48 cut therethrough. The slot 48 facilitates electrical coupling of the memory chip 42 to the substrate 44 via bond wires (shown in FIG. 4). The frontside of the substrate 44 also contains a pressure relief area 50. The pressure relief area 50 is generally useful in the molding process, as will be discussed further below. While FIGS. 3–17 illustrate a BOC substrate 44, it should be evident that other substrate-based packages, such as COB or F/C, for example, may incorporate the techniques described herein.

Figure 4:
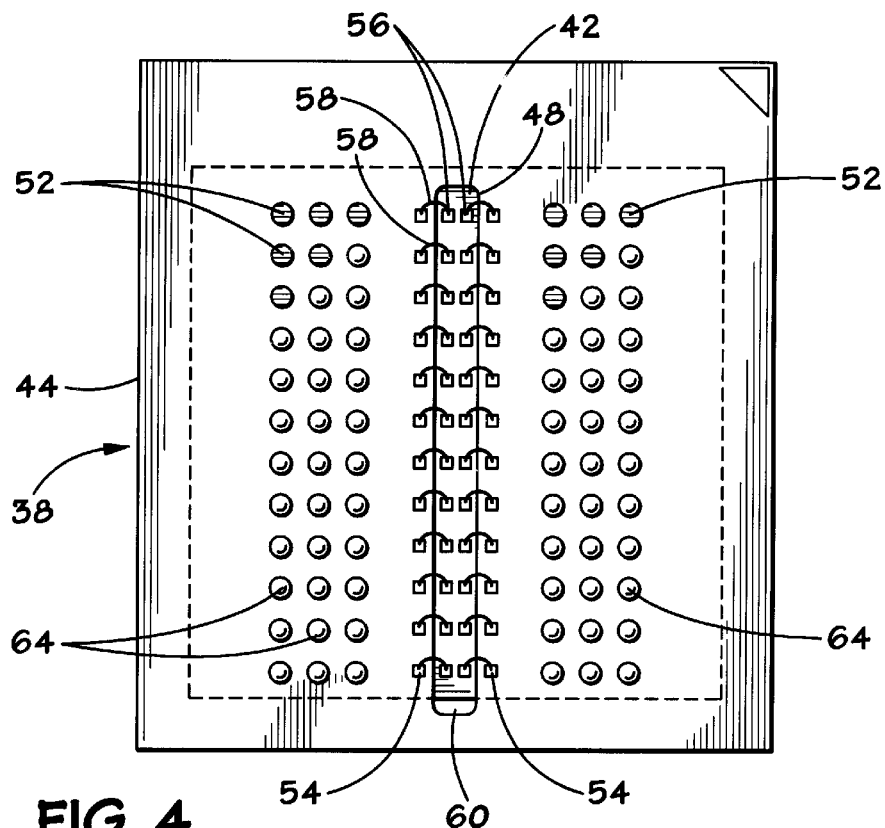
FIG. 4 illustrates a top backside view of a BOC substrate of FIG. 3 which has been electrically coupled to an I/C.
Figure 5:
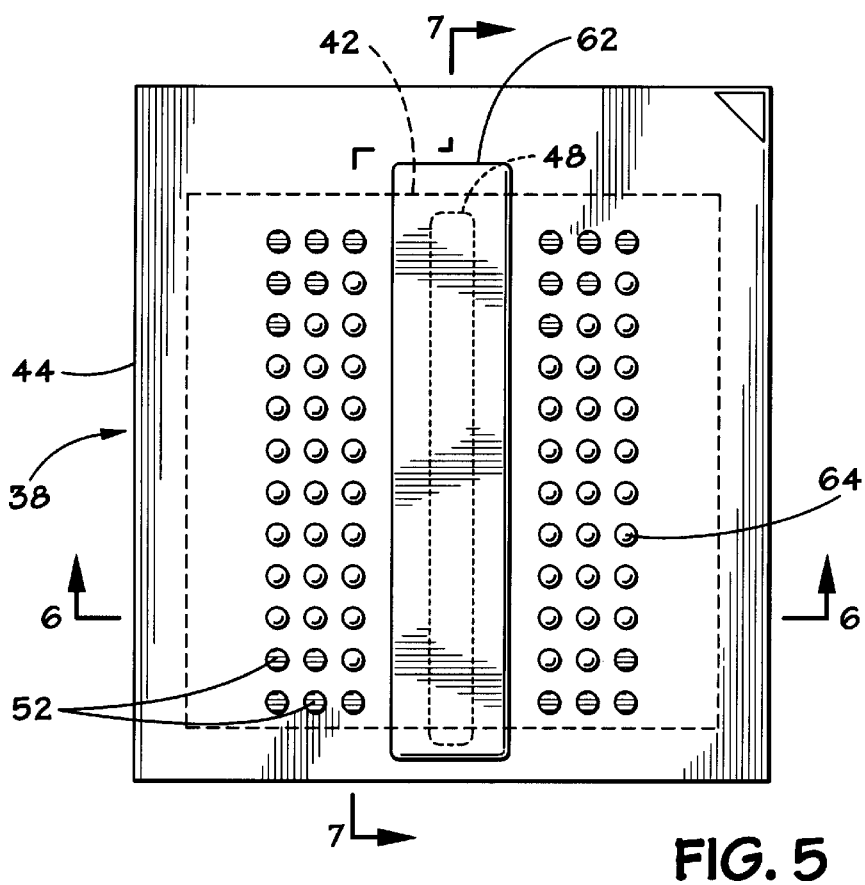
FIG. 5 illustrates a top backside view of a BOC substrate of FIG. 4 after the molding process.

FIGS. 4 and 5 illustrate a backside view of the device 38. For the sake of clarity, elements similar to the elements previously described will be designated by like reference numerals. FIG. 4 illustrates the device 38 before the encapsulation process. Since the BOC substrate 44 is depicted as a typical BGA device, a plurality of ball pads 52 are disposed on the backside of the substrate 44 to receive solder balls to couple the device 38 to a PCB 30 (shown in FIG. 2) or other external device. A plurality of bond pads 54 which facilitate electrical coupling of the substrate 44 to the memory chip 42 are also disposed on the backside of the substrate 44. The backside of the memory chip 42 can be seen through the slot 48. Bond pads 56 on the surface of the memory chip 42 are electrically coupled to bond pads 54 on the backside of the substrate 44 via bond wires 58.

Once the memory chip 42 is electrically coupled to the substrate 44, the device 38 is typically encapsulated in a molding compound to protect the memory chip 42 and the electrical connections created by the bond wires 58 from external elements such as moisture, dust or impact. A molding compound is typically disposed on the frontside of the substrate 44 in an injection system. The molding compound flows to the backside of the substrate 44 through an opening 60 in the slot 48 left by the placement of the memory chip 42. A molding cavity in the injection system limits the flow of the molding compound on the backside of the substrate 44 (shown in FIGS. 8A–8E). Once the encapsulation process has been completed, a portion of molding compound 62 (shown in FIG. 5) may completely encapsulate bond pads 54 and 56 as well as bond wires 58. Other configurations of backside molding compound 62 may be incorporated depending on the application.

Figure 6:
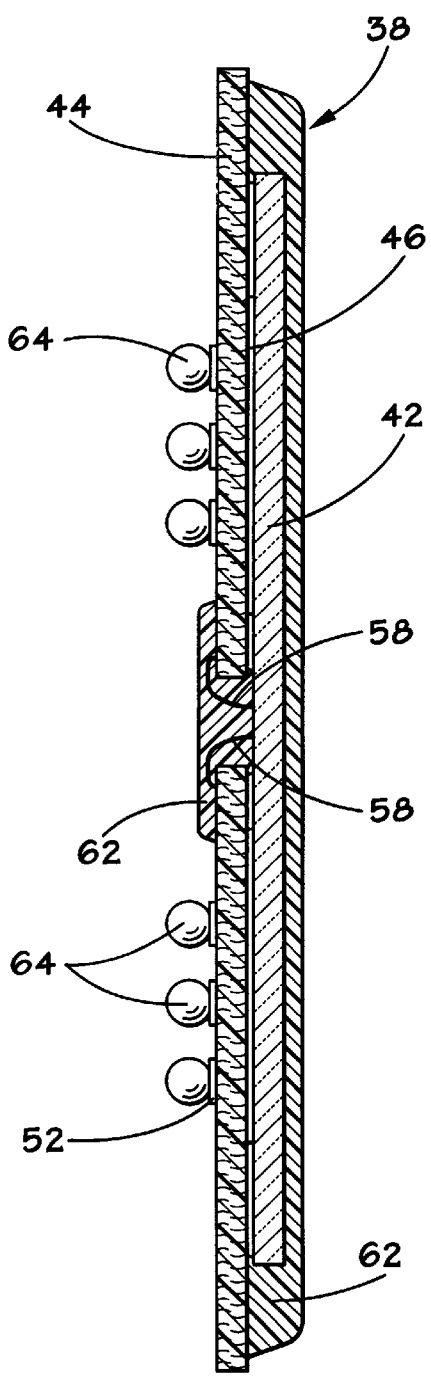
FIG. 6 illustrates a cross-sectional view of the BOC substrate illustrated in FIG. 5, taken along line 6—6.
Figure 7:
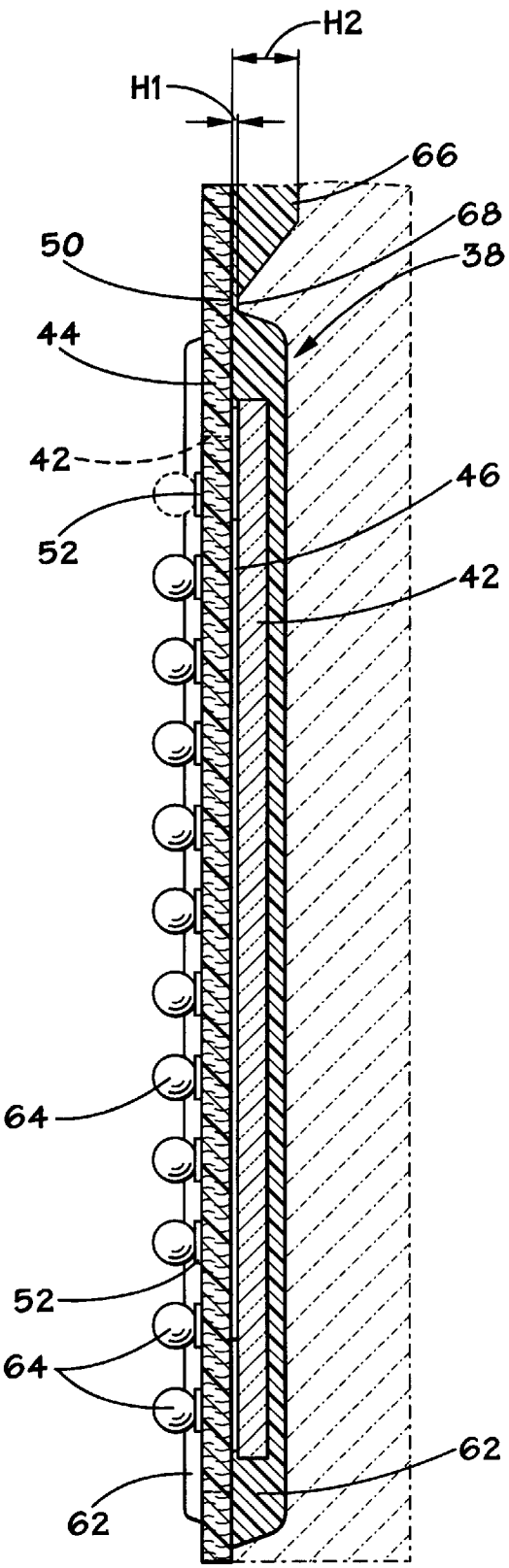
FIG. 7 illustrates a cross-sectional view of the BOC substrate illustrated in FIG. 5, taken along line 7—7.

Once the encapsulation process is complete, solder balls 64 may be disposed on the backside of the substrate 44, as shown in FIGS. 6 and 7. As should be clear from the cross-section taken along line 6—6, the molding compound 62 may be disposed on both the frontside and the backside of the substrate 44 to protect the memory chip 42 as well as the bond wires 58 between the memory chip 42 and the substrate 44. As previously discussed, the memory chip 42 is attached to the substrate 44 by an adhesive material 46, such as tape or paste.

Turning now to FIG. 7, a cross-section along line 7—7 is illustrated. The memory chip 42 is attached to the substrate 44 by an adhesive material 46. This illustration shows the device 38 before it is removed from the encapsulation system, which is discussed with further reference to FIGS. 8A–8E and FIG. 9. A molding compound 62 is forced through an area in the injection system referred to as the runner 66. The runner 66 guides the molding compound 62 through the gate 68. Once the molding compound 62 passes the gate 68, it is disposed about the memory chip 42 and on the backside of the substrate 44, as previously discussed. Once the injection process is complete, the molded runner 66 is broken away from the substrate 44 as the substrate 44 is removed from the injection molding system.

One of the purposes for the narrow height H1 in the molding system at the gate area 68 is to facilitate easy removal of the runner 66. The height H2 of the runner 66 may be approximately eight times the height H1 of the gate area 68. To facilitate a clean break of the runner 66 from the substrate 44, a pressure relief area 50 may be disposed on the top side of the substrate 44. The pressure relief area 50 is typically a metal trace consisting of gold (Au) and copper (Cu), but other materials such as Nickel (Ni) may be used. As the molded runner 66 is lifted from the substrate 44, the pressure relief area 50 helps prevent any lifting of the substrate laminate which may help prevent future reliability failures in the device 38. However, one problem associated with the pressure relief area 50 is that there is often a lifting of the metal trace thereby creating a metal bur. Both the removal of the runner 66 and the saw process used to singulate each package may create a metal bur. Advantageously, the present embodiment mitigates this condition, as will be discussed with reference to FIGS. 9–17.

At this point, to understand the present embodiment better, it may be helpful to illustrate a simplified process flow of an injection molding system. Turning now to FIGS. 8A–8E and FIG. 9, a typical injection molding system 75 in accordance with the present invention is illustrated. FIGS. 8A–8D illustrate a cross section of the injection molding system 75 in FIG. 9, taken along line 8—8. First, a tablet is placed into a pot 71 in the injection molding system 75. The tablet is a molding compound 70, typically a resin, which is heated to a melting point. As the tablet begins to melt, a plunger 72 in the injection molding system 75 forces the molding compound 70 upward. The injection molding system 75 is typically comprised of an upper molding cavity plate 74 and a lower molding cavity plate 76. Both of the cavity plates 74 and 76 contain cavities 78 and 80 to direct the flow of the molding compound 70 about the device 38. This particular injection molding system illustrates two integrated circuit devices 38 each comprising a substrate 44 and a memory chip 42. An injection molding system 75 may be configured so that a single tablet 70 is used to encapsulate one or more integrated circuit packages. However, for illustrative purposes, the present injection molding system 75 is configured to encapsulate two integrated circuit devices 38, simultaneously.

As the molding compound 70 melts, the plunger 72 forces the molding compound 70 upward through the injection system and into the runner 82, as illustrated in FIG. 8B. The runner 82 provides a conduit to direct the molding compound 70 to the device 38. As the runner 82 narrows, the molding compound 70 enters the gate area 84, as illustrated in FIG. 8C.

As the molding compound 70 is further forced through the system 75, the molding compound 70 flows through the runner 82, the gate area 84, into the lower cavity 80 through a slot in the substrate 44 and into the upper cavity 78, as illustrated in FIG. 8D. The lower cavity 78 facilitates encapsulation of the memory chip 42 on the frontside of the substrate 44. The upper cavity 78 facilitates encapsulation of the bond wires (not shown) on the backside of the substrate 44. Alternatively, the injection molding system 75 may be configured to receive a device 38 face-up.

Figure 8E:
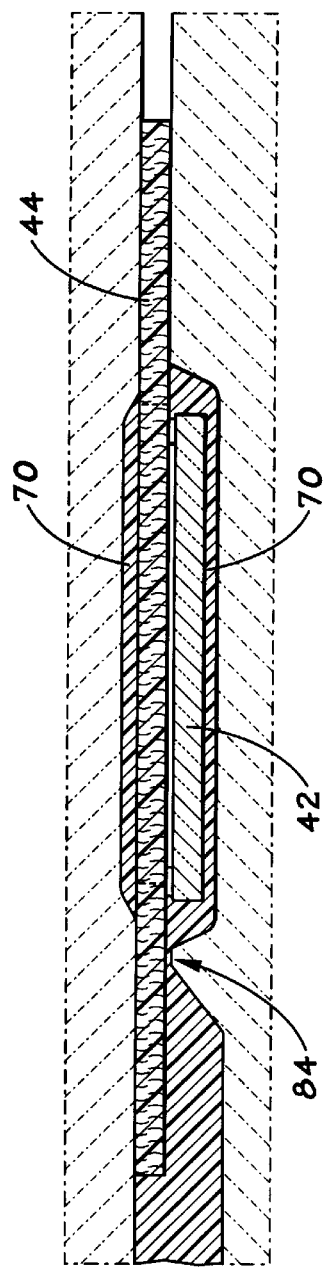

Finally, the device 38 can be removed from the injection molding system, as illustrated in FIG. 8E. The device 38 is separated from the molding compound 70 in the injection system by breaking the molding compound 70 at the gate area 84. The narrowed gate area 84 facilitates an easier break from the molding system 75. However, the break in the molding compound 70 at the gate area 84 may result in an uneven break site or lifting of the laminate on the substrate 44 which may contribute to future failures of the device 38.

Figure 9:
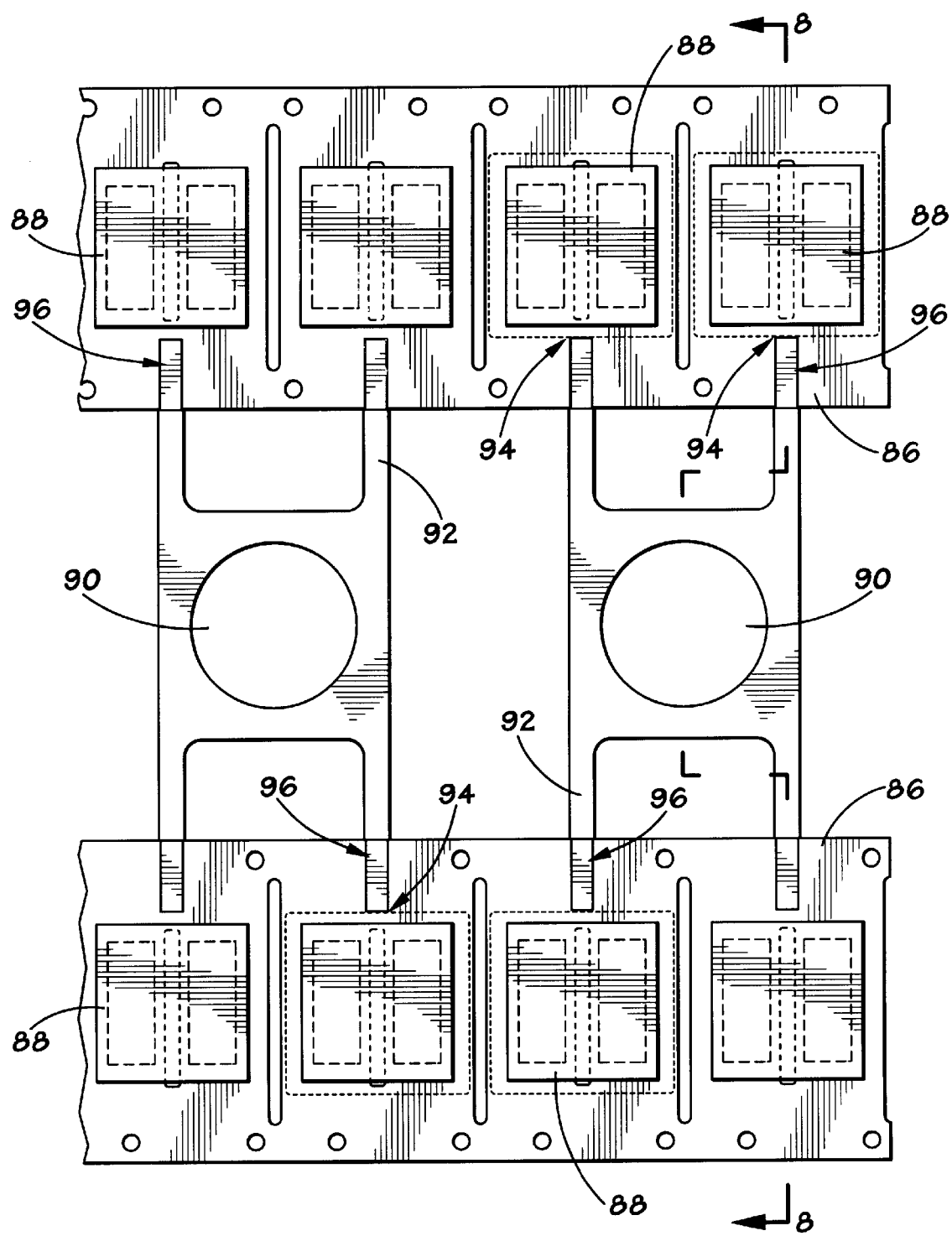
FIG. 9 illustrates a bottom plan view of an injection molding system in accordance with the present invention.

Advantageously, the present embodiment, as more clearly illustrated in FIG. 9, may reduce these effects. FIG. 9 illustrates the bottom view of an injection molding system 75. It should be noted that, in this embodiment, the substrate 86 is configured to accept a plurality of chips 88. After the molding process, the substrate 86 is removed from the system and the individual packages are singulated by a saw process, for instance. The cull area 90 in the injection molding system 75 provides an area in which to hold the molding compound which will be melted and disposed about the package. As described with reference to FIGS. 8A–8E, a tablet of molding compound disposed in the cull area 90 is heated and forced through the injection molding system. The molding compound flows through the runner 92 onto the surface of the substrate 86 and through the gate area 94.

While the upper and lower molding cavity plates are not illustrated, it should be clear from FIGS. 8A–8E that the flow of the molding compound limited by the cavity plates to flow in only desired areas. In this configuration of the injection molding system, a single tablet of molding compound will be used to encapsulate four devices. Each substrate 86 is disposed with one relief area 96 for each memory chip 42 that will be disposed on the substrate 86. The relief areas 96 will provide for a clean break of the package from the injection molding system. Typically, the relief area 96 is a metal trace comprised of Au/Cu, for instance, since the molding compound breaks away from metal easier than from a substrate material.

Although a relief area 96 comprised of a solid metal strip may help to prevent lifting of the laminate on the surface of the substrate 86 which may result from breaking the compound away from a bare substrate 86, metal burs are often created when a solid metal relief area 96 is used. A non-solid metallic relief area may reduce the effects of the problems set forth above. While it may seem incongruous to suggest that a relief area which is only partially covered by a metal trace would facilitate a comparatively easier removal of the substrate 86 from the system 75, this configuration and method may advantageously yield better results.

FIGS. 10–17 illustrate top views of alternate embodiments of the relief area wherein the relief area is a non-solid metallic region. The non-solid metallic region is generally comprised of one or more traces which may contain apertures, as will be discussed below. The metal traces may be disposed during the manufacturing of the substrate 100 or at sometime thereafter, by a sputtering process, for instance, such as physical vapor deposition (PVD) or chemical vapor deposition (CVD). In each figure, an integrated circuit device 98 is attached to a substrate 100. Phantom line 102 illustrates the edge of the gate area. Thus, the phantom line 102 demarcates where the molded runner will be broken after the molding process is complete and once the substrate 100 is removed from the injection molding system. Phantom line 102 may also mark where the inside edge of a saw is positioned during singulation. The relief area 96 is advantageously disposed on the surface of the substrate 100, through the gate area (phantom line 102) and into the runner area. Substrate slot 104 is also illustrated in each Figure. Specific configurations of the relief area are discussed below.

FIGS. 10 and 11 illustrate a top view of one embodiment of the relief area wherein the relief area 105 contains several parallel strips 106. In FIG. 10, the relief area 105 contains several metal strips 106, here four, disposed perpendicular to the gate area (phantom line 102). In FIG. 11, the parallel strips 106 that comprise the relief area 110 are disposed parallel to the gate area (phantom line 102). The relief areas 105 and 110 may be comprised of Au and Cu, for instance. This partial coverage of the relief area helps dissipate potential pressures within the package due to moisture and temperature variations. Advantageously, the dissipation of pressure resulting from this configuration of the relief areas 105 and 110 reduces the number of package failures due to separation of the laminate from the substrate 100.

FIGS. 12 and 13 illustrate a top view of alternate embodiments of the relief area wherein the relief areas 120 and 130 contain a solid trace of metal configured with a plurality of circular apertures 125 and 135 therethrough. In FIG. 12, the relief area 120 contains a solid metal trace 122 with circular apertures 125 arranged in two rows perpendicular to the gate area (phantom line 102). In FIG. 13, the relief area 130 contains a solid metal trace 132 with circular apertures 135 arranged in five rows perpendicular to the gate area (phantom line 102). The relief areas 120 and 130 may be comprised of Au and Cu, for instance. The circular apertures 125 and 135 are areas containing no metal, and thus are openings in the relief area 120 and 130 which provide exposed substrate areas within the bounded apertures. This partial coverage of the relief area helps dissipate potential pressures within the package due to moisture and temperature variations. Advantageously, the dissipation of pressure resulting from this configuration of the relief areas 120 and 130 reduces the number of package failures due to separation of the laminate from the substrate 100.

Figure 14:
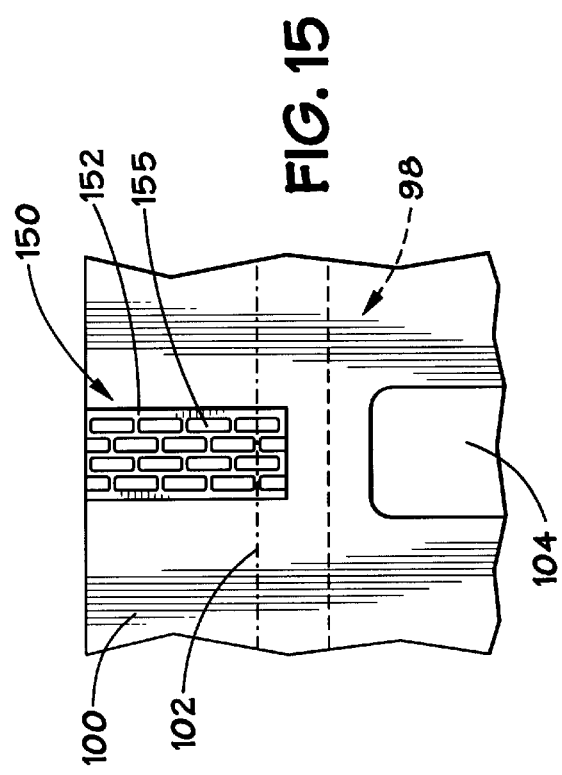
FIG. 14 illustrates a fifth embodiment of the relief area in accordance with the present invention.
Figure 15:
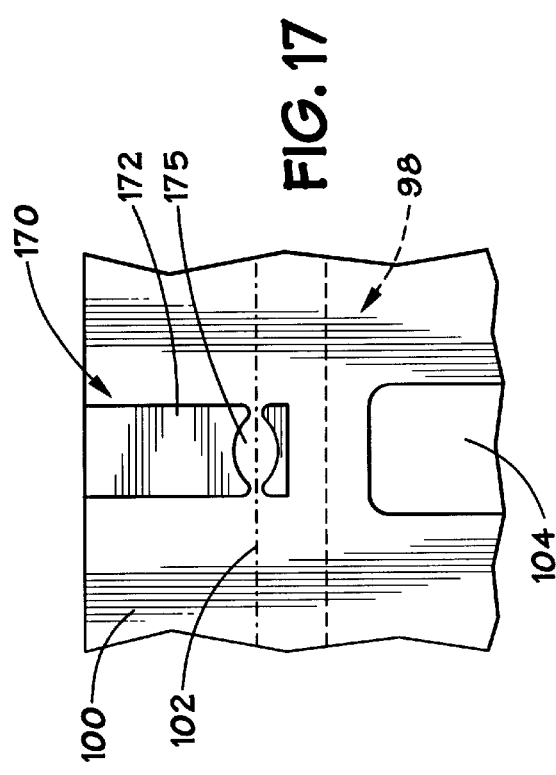
FIG. 15 illustrates a sixth embodiment of the relief area in accordance with the present invention.
Figure 16:
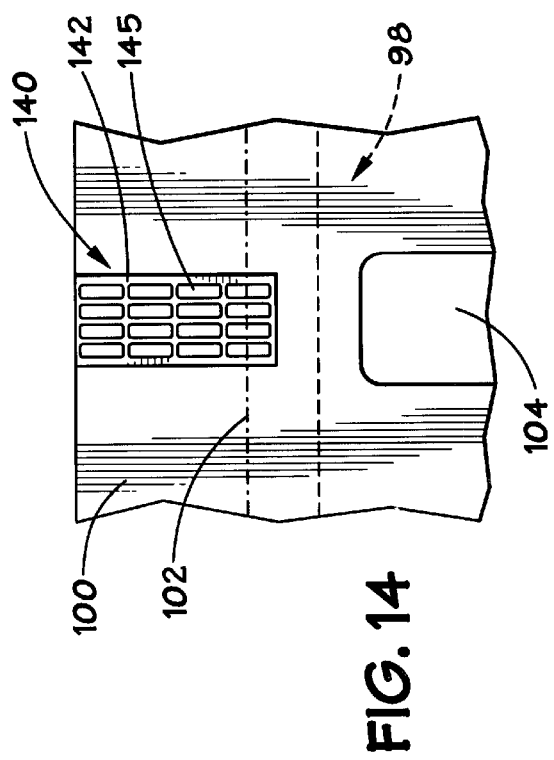
FIG. 16 illustrates a seventh embodiment of the relief area in accordance with the present invention.

FIGS. 14, 15 and 16 illustrate a top view of other embodiments of the relief area wherein the relief areas 140, 150, and 160 contain a solid trace of metal configured with a plurality of rectangular apertures 145, 155, and 165 therethrough. In FIG. 14, the relief area 140 contains a solid metal trace 142 with rectangular apertures 145 arranged in four rows perpendicular to the gate area (phantom line 102). In FIG. 15, the relief area 150 contains a solid metal trace with rectangular apertures 155 arranged in four staggered rows perpendicular to the gate area (phantom line 102). The relief areas 140 and 150 may be comprised of Au and Cu, for instance. While the apertures 145 and 155 are illustrated as rectangles with curved corners, it should be evident that true rectangular apertures with 90 degree corners may also be used. In FIG. 16, the relief area 160 contains a solid metal trace with rectangular cutouts 165 arranged parallel to the gate area (phantom line 102) and extending to the periphery of the relief area 160. The relief area 160 may be comprised of Au and Cu, for instance. The rectangular apertures 145, 155 and 165 are areas containing no metal, and thus are openings in the relief areas 140, 150 and 160 which provide exposed substrate areas within the bounded apertures. This partial coverage of the relief area helps dissipate potential pressures within the package due to moisture and temperature variations. Advantageously, the dissipation of pressure resulting from this configuration of the relief areas 140, 150, and 160 reduces the number of package failures due to separation of the laminate from the substrate 100.

Figure 17:
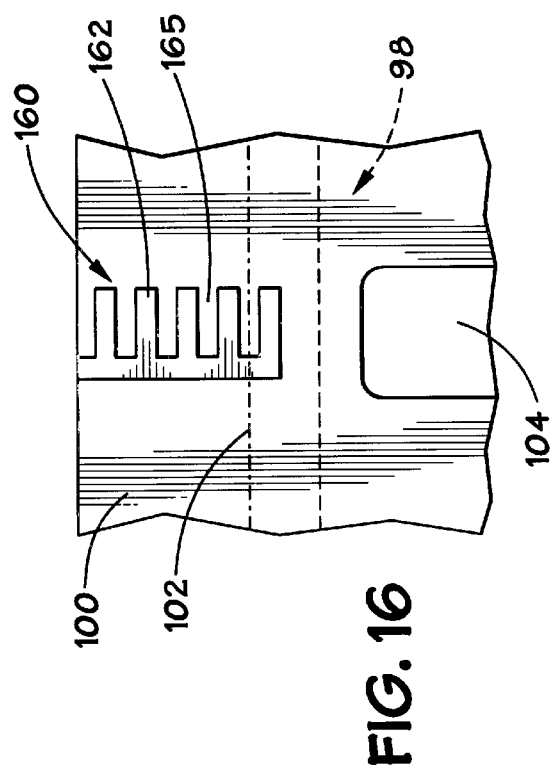
FIG. 17 illustrates an eighth embodiment of the relief area in accordance with the present invention.

FIG. 17 illustrates a top view of still another embodiment of the relief area wherein the relief area 170 contains a solid trace 172 of metal configured with a plurality of curved apertures therethrough. The relief area 170 contains a solid metal trace 172 with curved cutouts 175 arranged parallel to the gate area (phantom line 102). The curved cutouts 175 may be arranged parallel to the gate area (phantom line 102), as shown, or the curved cutouts 175 may be arranged perpendicular to the gate area (phantom line 102). The relief area 170 may be comprised of Au and Cu, for instance. The curved cutouts 175 are areas containing no metal, and thus are openings in the relief area 170 which provide exposed substrate areas. This partial coverage of the relief area helps dissipate potential pressures within the package due to moisture and temperature variations. Advantageously, the dissipation of pressure resulting from this configuration of the relief area 170 reduces the number of package failures due to separation of the laminate from the substrate 100.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. Further, any variations to the adhesive patterns or any combination of the above mentioned patterns clearly fall within the spirit and scope of the invention.

What is claimed is:

1. A system comprising:
   a processor; and
   a memory package operatively coupled to the processor, the memory package comprising:
      a memory device;
      a substrate coupled to the memory device, the substrate comprising a relief region, wherein the relief region comprises at least one metal strip disposed on the top surface of the substrate and extending to an edge of an outer perimeter of the memory package, the at least one metal strip having a plurality of apertures therethrough; and
      a molding compound disposed on the top surface of the substrate and about a perimeter of the memory device.

2. The system, as set forth in claim 1, wherein the memory device is mounted on the substrate in a board-on-chip fashion.

3. The system, as set forth in claim 1, wherein the metal strip is comprised of gold and copper.

4. The system, as set forth in claim 1, wherein the apertures are substantially circular.

5. The system, as set forth in claim 1, wherein the apertures comprise curved cut-outs.

6. The system, as set forth in claim 1, wherein the apertures are substantially rectangular.

7. The system, as set forth in claim 1, wherein the relief region comprises a plurality of metal strips disposed on the top surface of the substrate and extending to the edge of the outer perimeter of the memory package, wherein the plurality of metal strips are spaced apart to form the apertures.

8. The system, as set forth in claim 7, wherein the metal strips are disposed substantially perpendicular to the edge of the outer perimeter of the memory package.

9. The system, as set forth in claim 7, wherein the metal strips are disposed substantially parallel to the edge of the outer perimeter of the memory package.

10. An integrated circuit package comprising:
    an integrated circuit device;
    a substrate coupled to the integrated circuit device, the substrate having a relief region, wherein the relief region comprises at least one metal strip disposed on the top surface of the substrate and extending to an edge of an outer perimeter of the integrated circuit package, the at least one metal strip having a plurality of apertures therethrough; and
    a molding compound disposed on a top surface of the substrate and about a perimeter of the integrated circuit die.

11. The package, as set forth in claim 10, wherein the integrated circuit device comprises a memory device.

12. The package, as set forth in claim 10, wherein the memory is mounted on the substrate in a board-on-chip fashion.

13. The package, as set forth in claim 10, wherein the metal strip is comprised of gold and copper.

14. The package, as set forth in claim 10, wherein the apertures are substantially circular.

15. The package, as set forth in claim 10, wherein the apertures comprise curved cut-outs.

16. The package, as set forth in claim 10, wherein the apertures comprise rectangular cut-outs.

17. The package, as set forth in claim 10, wherein the relief region comprises a plurality of metal strips disposed on the top surface of the substrate and extending to the edge of the outer perimeter of the integrated circuit package, wherein the plurality of metal strips are spaced apart to form the apertures.

18. The package, as set forth in claim 17, wherein the metal strips are disposed substantially perpendicular to the edge of the outer perimeter of the integrated circuit package.

19. The package, as set forth in claim 17, wherein the metal strips are disposed substantially parallel to the edge of the outer perimeter of the integrated circuit package.

20. A method of building an integrated circuit package comprising the acts of:
    (a) providing a substrate;
    (b) disposing at least one metal trace on the top surface of the substrate, the at least one metal trace extending to an edge of an outer perimeter of the integrated circuit package and having a plurality of apertures therethrough;
    (c) disposing an integrated circuit device onto the substrate; and
    (d) disposing a molding compound about the integrated circuit device.

21. The method, as set forth in claim 20, wherein the memory device is mounted on the substrate in a board on chip.

22. The method, as set forth in claim 20, wherein act (b) comprises disposing a metal trace having circular apertures.

23. The method, as set forth in claim 20, wherein act (b) comprises disposing a metal trace having curved cut-outs.

24. The method, as set forth in claim 20, wherein act (b) comprises disposing a metal trace having rectangular apertures.

25. The method, as set forth in claim 20, wherein act (b) comprises disposing a plurality of metal traces on the top surface of the substrate, the metal traces extending to the edge of the outer perimeter of the integrated circuit package, wherein the plurality of metal strips are spaced apart to form the apertures.

26. The method, as set forth in claim 25, wherein act (b) comprises disposing a plurality of metal traces substantially perpendicular to the edge of the integrated circuit package.

27. The method, as set forth in claim 25, wherein act (b) comprises disposing a plurality of metal traces substantially parallel to the edge of the integrated circuit package.

28. The method, as set forth in claim 20, wherein act (c) comprises disposing a memory device onto the substrate.

29. The method, as set forth in claim 20, wherein act (d) comprises disposing a resin about the integrated circuit die.

30. A method of building an integrated circuit package comprising the acts of:
 (a) providing a substrate having a relief area on the surface of the substrate, wherein the relief area comprises at least one metal trace on the top surface of the substrate, the at least one metal trace extending to an edge of an outer perimeter of the integrated circuit package and having a plurality of apertures therethrough;
 (b) disposing an integrated circuit device onto the substrate; and
 (c) disposing a molding compound about the integrated circuit device.

31. The method, as set forth in claim 30, wherein the memory device is mounted on the substrate in a board on chip fashion.

32. The method, as set forth in claim 30, wherein act (a) comprises disposing a metal trace having circular apertures.

33. The method, as set forth in claim 30, wherein act (b) comprises disposing a metal trace having curved cut-outs.

34. The method, as set forth in claim 30, wherein act (b) comprises disposing a metal trace having rectangular apertures.

35. The method, as set forth in claim 30, wherein act (a) comprises disposing a plurality of metal traces on the top surface of the substrate, the metal traces extending to the edge of the outer perimeter of the integrated circuit package, wherein the plurality of metal strips are spaced apart to form the apertures.

36. The method, as set forth in claim 35, wherein act (a) comprises disposing a plurality of metal traces perpendicular to the edge of the integrated circuit package.

37. The method, as set forth in claim 35, wherein act (a) comprises disposing a plurality of metal traces substantially parallel to the edge of the integrated circuit package.

38. The method, as set forth in claim 30, wherein act (b) comprises disposing a memory device onto the substrate.

39. The method, as set forth in claim 30, wherein act (c) comprises disposing a resin about the integrated circuit device.

* * * * *